TRANSISTOR A.C. GATE CIRCUIT
Filed Feb. 26, 1964
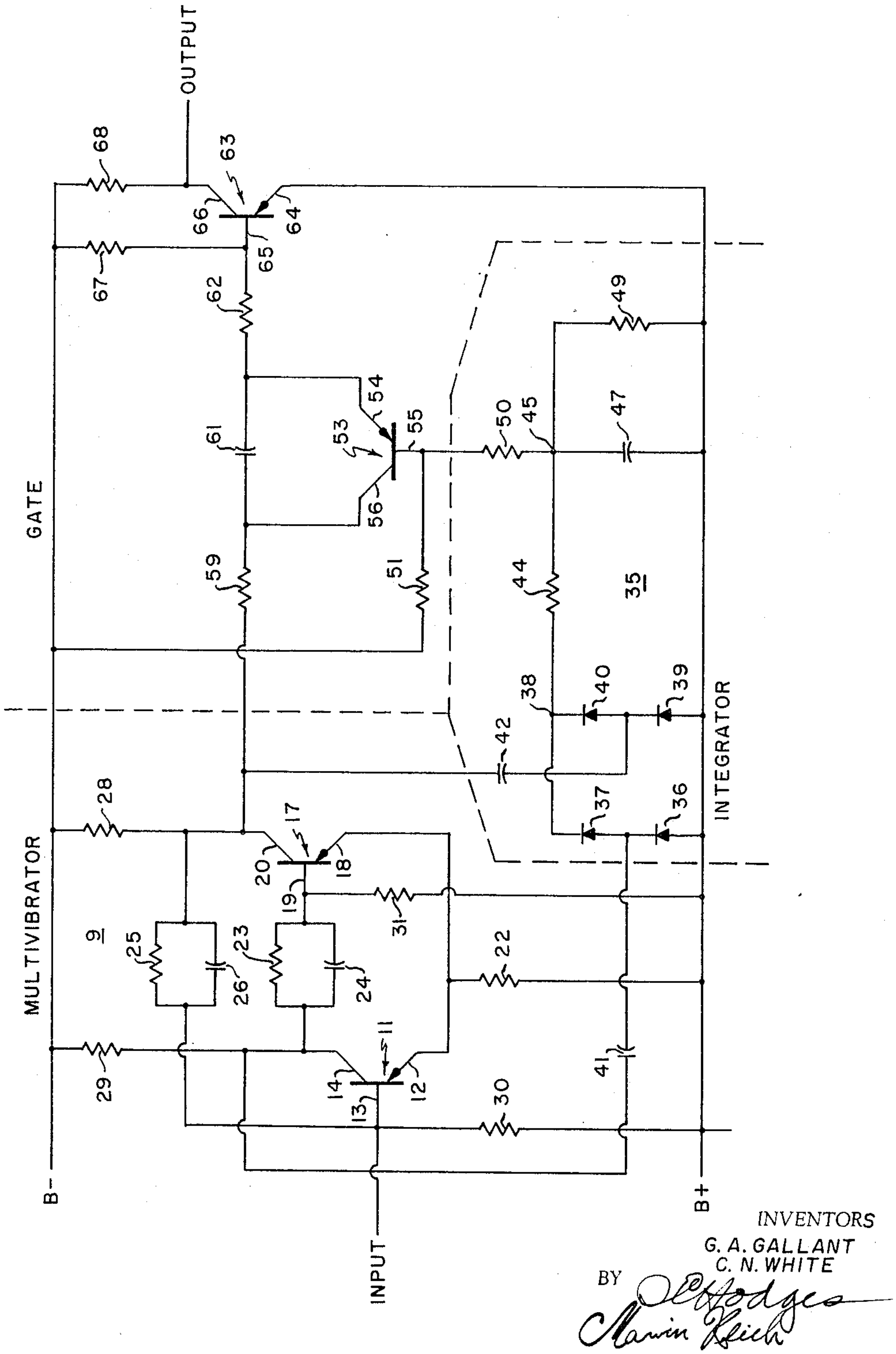
INVENTORS
G. A. GALLANT
C. N. WHITE
BY [signature]
ATTYS.

United States Patent Office 3,289,013
Patented Nov. 29, 1966

3,289,013
TRANSISTOR A.C. GATE CIRCUIT

George A. Gallant and Conrad N. White, Burlington, Vt., assignors, by mesne assignments, to the United States of America as represented by the Secretary of the Navy Filed Feb. 26, 1964, Ser. No. 347,632
13 Claims. (Cl. 307—88.5)

This invention relates to a gate circuit and more particularly to a transistorized gate free of extraneous pulses.

Transistorized gates have been utilized in the prior art for gating electronic signals and generally operate satisfactorily. However, existing transistorized gates have, under certain conditions, generated extraneous pulses when they are either turned on or off.

An object of the present invention is to provide an electronic gate which does not generate any extraneous pulses.

Another object is to provide an electronic gate having a predetermined time delay before passing the signals to be gated.

A further object is to provide an electronic gate which is turned on by the signal to be gated.

In accordance with a preferred form of the invention a source of alternating current signals supplies the signal to be gated to the input of a transistorized gate. A portion of the alternating current signal is simultaneously fed to an integrating network for deriving a control signal for controlling the gate. The integrating network provides a predetermined time delay before turning the gate on. After cessation of the input signal the gate automatically returns to the closed condition.

Other objects and many of the attendant advantages of this invention will readily be appreciated as the same becomes better understood by reference to the following detailed description when considered in connection with the accompanying drawing in which the sole figure illustrates a circuit diagram of a gate embodying the invention.

The circuit of the figure comprises a bistable multivibrator 9 having a first transistor 11 which has an emitter electrode 12, a base electrode 13 and a collector electrode 14, and a second transistor 17 which has an emitter electrode 18, a base electrode 19 and a collector electrode 20. The emitter electrode 12 of transistor 11 is connected to the emitter electrode 18 of transistor 17 and a resistor 22 is connected between the parallel-connected emitter 12 and 18 of transistors 11 and 17 respectively and a source of positive reference potential indicated as B+. A resistor 23 is connected in parallel with a capacitor 25 between the collector electrode 14 of transistor 11 and the base electrode 19 of transistor 17. A resistor 25 is connected in parallel with capacitor 26 between the collector electrode 20 of transistor 17 and the base electrode 13 of transistor 11.

A first bias resistor 28 is connected between a source negative reference potential indicated as B— and the collector electrode 20 of transistor 17, and a second bias resistor 29 is connected between source of B— potential and the collector electrode 14 of transistor 11. A third bias resistor 30 is connected between the base electrode 13 of transistor 11 and the source of B+ potential. A fourth bias resistor 31 is connected between the base electrode 19 of transistor 17 and the source of B+ potential.

An integrator circuit 35 is provided for the gate. The integrator 35 is composed of a first diode 36 having its anode connected to the source of B+ potential and its cathode connected to the anode of a second diode 37. A third diode 39 has its anode connected to the source of B+ potential and its cathode connected to the anode of a fourth diode 40. The cathodes of diode 37 and diode 40 are both connected to the junction 38. The collector electrode 14 of transistor 11 is connected through a capacitor 41 to the junction of diodes 36 and 37. The collector electrode 20 of the transistor 17 is connected via capacitor 42 to the junction of diodes 39 and 40. A resistor 44 is connected between junction points 38 and 45. An integrating capacitor 47 is connected in parallel with resistance 49 between junction 45 and the source of B+ potential.

A transistor 53 having an emitter electrode 54, base electrode 55 and collector electrode 56 has its base electrode 55 connected to junction point 45 through resistor 50. A resistor 51 connects the base electrode 51 of transistor 53 with the source of B— potential. The collector electrode 20 of transistor 17 is connected to the collector electrode 56 of transistor 53 by a resistor 59. A capacitor 61 has one end connected to the emitter electrode 54 of transistor 53 and the other end connected to the collector electrode 56 of transistor 53.

A transistor 63 having an emitter electrode 64, base electrode 65 and collector electrode 66 has its base electrode 65 connected to the emitter electrode 54 of transistor 53 thru a resistor 62. The emitter electrode 64 of transistor 63 is connected to the source of B+ potential. Bias resistor 67 is connected between the source of B— potential and the base electrode 65 of transistor 63 and resistor 68 is connected between the collector electrode 66 of transistor 63 and the source of B— potential.

The circuit operates as follows: A source of alternately positive and negative going pulses or waves are fed to the input which is connected to the base electrode 13 of transistor 11. Assuming that transistor 11 is cut off and that transistor 17 is conducting, then a negative-going pulse or wave on the base electrode 13 will cause the transistor 11 to become conductive and the transistor 17 to become nonconductive due to the regenerative action of the bistable multivibrator. Transistor 11 will remain conductive until the next positive pulse or wave is applied to its base electrode 13. The next positive pulse or wave causes transistor 11 to become nonconductive and transistor 17 to become conductive.

Turning now to the operation of the gate portion of the circuit, the gate is closed when transistors 53 and 63 are conductive and the multivibrator is not in its alternating state. Transistor 53 is normally biased for conduction by the bias resistor 51 and transistor 63 is biased to saturation by bias resistor 67 with the aid of a biasing network composed of resistors 28, 59, 62 and the normally conductive transistor 53.

Turning now to the integrator, there is employed finite time, e.q. about 0.5 millisecond or any other suitable time duration for the alternating multivibrator to charge the integrating capacitor 47 to a sufficiently positive voltage to cause the transistor 53 to become nonconductive. The pulses produced by the multivibrators are rectified by diodes 36, 37, 39 and 40 and are integrated by the capacitor 47. The positive voltage appearing across capacitor 47 at junction point 45 causes a positive voltage to appear on the base electrode 55 of transistor 53, thereby extinquishing the conduction of transistor 53. Positive-going pulses appearing on the collector electrode 20 of transistor 17 are transmitted via resistor 59, capacitor 61 and resistor 62 to the base electrode 65 of the transistor 63, thereby extinguishing the conduction of transistor 63. There is thus generated a negative output pulse on the collector electrode 66 of transistor 63. When the state of conduction of the multivibrator changes, a negative-going voltage appears on the collector electrode 20 of transistor 17. Said negative-going pulse is transmitted to the base electrode 65 of transistor 63 via resistor 59, capacitor 61 and resistor 62 causing the transistor 63 to become highly conductive. When the transistor 63 is conducting its collector electrode 66 is a relatively positive potential.

When the multivibrator stops oscillating, then capacitor 47 discharges through resistor 49 placing a negative potential on the base electrode 55 of transistor 53, causing transistor 53 to become conductive. Capacitor 61 is discharged by transistor 53 closing the gate without generating an extraneous output pulse on transistor 63.

For purposes of illustration only, and not by way of limitation, values of the circuit components in an embodiment of the circuit which has been built are listed in the table below. It is to be understood that other values for the components may be utilized if desired.

| | | |
|---|---|---|
| Resistor 22 | ohms | 100 |
| Resistor 23 | do | 27K |
| Resistor 25 | do | 27K |
| Resistor 28 | do | 1K |
| Resistor 29 | do | 1K |
| Resistor 30 | do | 51K |
| Resistor 31 | do | 51K |
| Resistor 44 | do | 10K |
| Resistor 49 | do | 100K |
| Resistor 50 | do | 33K |
| Resistor 51 | do | 150K |
| Resistor 59 | do | 10K |
| Resistor 62 | do | 4.7K |
| Resistor 67 | do | 51K |
| Capacitor 24 | μμf | 100 |
| Capacitor 26 | μμf | 100 |
| Capacitor 47 | μf | 2 |
| Capacitor 61 | μf | 2 |

What is claimed is:

1. A gating system in which the signal to be gated is utilized to cause the gate to turn on when said signal is present and off in the absence of said signal, comprising:

means for sampling a portion of said signal;

means connected to said sampling means for integrating said sampled portion of said signal;

gating means having an input and an output; and means responsive to said integrating means for coupling said signal to the input of said gating means only when said signal is present;

said integrating means being connected to said last-named coupling means whereby signals are gated to the output of said gate in response to a control signal developed by said integrating means.

2. A gating system in which the signal to be gated is utilized to cause the gate to be turned on and off, as defined in claim 1 but further characterized by having a rectifying network;

said rectifying network being connected between said sampling means and said integrating means.

3. A gating system in which the signal to be gated is utilized to cause the gate to be turned on and off as defined in claim 2 but further characterized by having a bistable multivibrator;

said signal to be gated is connected to the input of said bistable multivibrator and the output of said bistable multivibrator is connected to said means responsive to said integrating means to couple said incoming signal to the input of said gating means.

4. A gating system in which the signal to be gated is utilized to cause the gate to be turned on and off as defined in claim 1 but further characterized by having a bistable multivibrator;

said signal to be gated is connected to the input of said bistable multivibrator and the output of said multivibrator is connected to said means responsive to said integrating means to couple said incoming signal to the input of said gating means.

5. A gating system in which the signal to be gated is utilized to cause the gate to be turned on when said signal is present and off in the absence of said signal comprising:

means for sampling a portion of said signal;

means for integrating said sampled portion of said signal connected to said sampling means;

an electronic valve gating means having an input terminal and an output terminal;

means to couple said signal to the input of said electronic valve gating means connected to the input of said electronic valve gate; and control means for opening and closing said electronic valve gating means responsive to said integrating means connected in parallel with at least part of said means to couple said incoming signal to the input of said electronic valve gating means only when said signal is present, said last named control means connected to said integrating means whereby signals are gated to the output of the electronic valve gating means in response to a control signal developed by said integrating means.

6. A gating system in which the signal to be gated is utilized to cause the gate to be turned on and off, as defined in claim 5 but further characterized by having a rectifying network;

said rectifying network being connected between said sampling means and said integrating means.

7. A gating system in which the signal to be gated is utilized to cause the gate to be turned on and off as defined in claim 6 but further characterized by having said electronic valve gating means comprising a transistor.

8. A gating system in which the signal to be gated is utilized to cause the gate to be turned on and off as defined in claim 7 but further characterized by having said control means for opening and closing said electronic valve gating means responsive to said integrating means comprising a transistor.

9. A gating system in which the signal to be gated is utilized to cause the gate to be turned on and off as defined in claim 6 but further characterized by having said control means for opening and closing said electronic valve gating means responsive to said integrating means comprising a transistor.

10. A gating system in which the signal to be gated is utilized to cause the gate to be turned on and off as defined in claim 5 but further characterized by having said electronic valve gating means comprising a transistor.

11. A gating system in which the signal to be gated is utilized to cause the gate to be turned on and off as defined in claim 10 but further characterized by having said control means for opening and closing said electronic valve gating means responsive to said integrating means comprising a transistor.

12. A gating system in which the signal to be gated is utilized to cause the gate to be turned on and off as defined in claim 5 but further characterized by having said control means for opening and closing said electronic valve gating means responsive to said integrating means comprising a transistor.

13. A gating system in which the signal to be gated is utilized to cause the gate to be turned on and off comprising:

a bistable multivibrator having an input and a pair of outputs;

means for sampling a portion of said signal having a pair of outputs and a pair of inputs, each of said inputs connected to a respective output of said bistable multivibrator:

a gate transistor having an input electrode and an output electrode;

a capacitor connected between one of the outputs of said multivibrator and the input electrode of said gate transistor;

a rectifying network having its inputs connected to the outputs of said sampling means; and an integrating means;

the output of said rectifying network connected to said integrating means and a second transistor having a base electrode, emitter electrode and a collector electrode, the emitter electrode of said second transistor connected to one end of said capacitor and said collector electrode of said second transistor connected to the other end of said capacitor, said base electrode of said second transistor connected to said integrating means whereby signals are gated to the output electrode of said gate transistor in response to a control signal developed by said integrating means.

References Cited by the Examiner

UNITED STATES PATENTS

| | | | |
|---|---|---|---|
| 2,545,665 | 3/1951 | Larsen | 84—1.19 |
| 2,793,554 | 5/1957 | Faust | 84—1.26 |
| 3,150,228 | 9/1964 | Gibbs | 84—1.26 |

ARTHUR GAUSS, *Primary Examiner.*

D. D. FORRER, *Assistant Examiner.*